United States Patent
Xia et al.

(10) Patent No.: US 11,792,980 B2
(45) Date of Patent: Oct. 17, 2023

(54) CONTACT STRUCTURES HAVING CONDUCTIVE PORTIONS IN SUBSTRATE IN THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Ji Xia, Wuhan (CN); Wei Xu, Wuhan (CN); Pan Huang, Wuhan (CN); Wenxiang Xu, Wuhan (CN); Beihan Wang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/532,131

(22) Filed: Nov. 22, 2021

(65) Prior Publication Data

US 2022/0085044 A1    Mar. 17, 2022

Related U.S. Application Data

(60) Division of application No. 16/739,681, filed on Jan. 10, 2020, now Pat. No. 11,411,014, which is a
(Continued)

(51) Int. Cl.
*H01L 21/768* (2006.01)
*H10B 41/27* (2023.01)
(Continued)

(52) U.S. Cl.
CPC ............... *H10B 41/27* (2023.02); *G11C 5/04* (2013.01); *G11C 5/06* (2013.01); *G11C 16/04* (2013.01);
(Continued)

(58) Field of Classification Search
CPC ......... H01L 27/11556; H01L 21/76838; H01L 27/11582; H01L 23/528
See application file for complete search history.

(56) References Cited

U.S. PATENT DOCUMENTS 9,230,979 B1 * 1/2016 Pachamuthu ..... H01L 27/11582
9,991,282 B1    6/2018 Shimizu et al.
(Continued)

FOREIGN PATENT DOCUMENTS

CN    107996000 A    5/2018
CN    109473433 A    3/2019
(Continued)

OTHER PUBLICATIONS

International Search Report issued in corresponding International Application No. PCT/CN2019/120220, dated Jul. 29, 2020, 4 pages.

*Primary Examiner* — Thanh Y. Tran
(74) *Attorney, Agent, or Firm* — BAYES PLLC

(57) ABSTRACT

Embodiments of structure and methods for forming a three-dimensional (3D) memory device are provided. In an example, a method for forming a 3D memory device includes forming a first source contact portion in a substrate, forming a dielectric stack over the first source contact portion, and forming a slit opening extending in the dielectric stack and exposing the first source contact portion. The method also includes forming a plurality of conductor layers through the slit opening and form a second source contact portion in the slit opening and in contact with the first source contact portion.

20 Claims, 10 Drawing Sheets

Related U.S. Application Data continuation of application No. PCT/CN2019/120213, filed on Nov. 22, 2019.

(51) Int. Cl.
    *G11C 5/04*     (2006.01)
    *G11C 5/06*     (2006.01)
    *G11C 16/04*     (2006.01)
    *H01L 23/528*     (2006.01)
    *H01L 23/532*     (2006.01)
    *H10B 43/27*     (2023.01)

(52) U.S. Cl.
    CPC ...... *H01L 21/76838* (2013.01); *H01L 23/528* (2013.01); *H01L 23/53214* (2013.01); *H01L 23/53228* (2013.01); *H01L 23/53257* (2013.01); *H10B 43/27* (2023.02)

(56) References Cited

U.S. PATENT DOCUMENTS

| | | |
|---|---|---|
| 10,147,732 B1 | 12/2018 | Hu et al. |
| 2012/0273965 A1 | 11/2012 | Seo et al. |
| 2017/0104068 A1 | 4/2017 | Lee et al. |
| 2017/0148804 A1 | 5/2017 | Lee et al. |
| 2018/0350825 A1 | 12/2018 | Ogawa et al. |
| 2019/0074292 A1 | 3/2019 | Hwang et al. |
| 2019/0244892 A1* | 8/2019 | Zhu .................. H01L 27/11575 |
| 2019/0267333 A1 | 8/2019 | Hong et al. |
| 2019/0279996 A1 | 9/2019 | Yamashita |
| 2020/0185407 A1* | 6/2020 | Xiao .................. H01L 27/11573 |
| 2020/0194445 A1* | 6/2020 | Sharangpani ... H01L 21/823487 |
| 2020/0235090 A1* | 7/2020 | Chowdhury ............ H01L 24/08 |
| 2020/0235121 A1* | 7/2020 | Liu .................. H01L 21/02532 |
| 2020/0258904 A1* | 8/2020 | Kai .................. H01L 27/11573 |

FOREIGN PATENT DOCUMENTS

| | | |
|---|---|---|
| CN | 109690775 A | 4/2019 |
| CN | 109904166 A | 6/2019 |
| CN | 110114875 A | 8/2019 |
| CN | 110114881 A | 8/2019 |
| CN | 110121775 A | 8/2019 |
| CN | 110233153 A | 9/2019 |
| CN | 110249427 A | 9/2019 |
| TW | 201836128 A | 10/2018 |
| TW | 201931570 A | 10/2018 |
| TW | 201937698 A | 9/2019 |

* cited by examiner

300

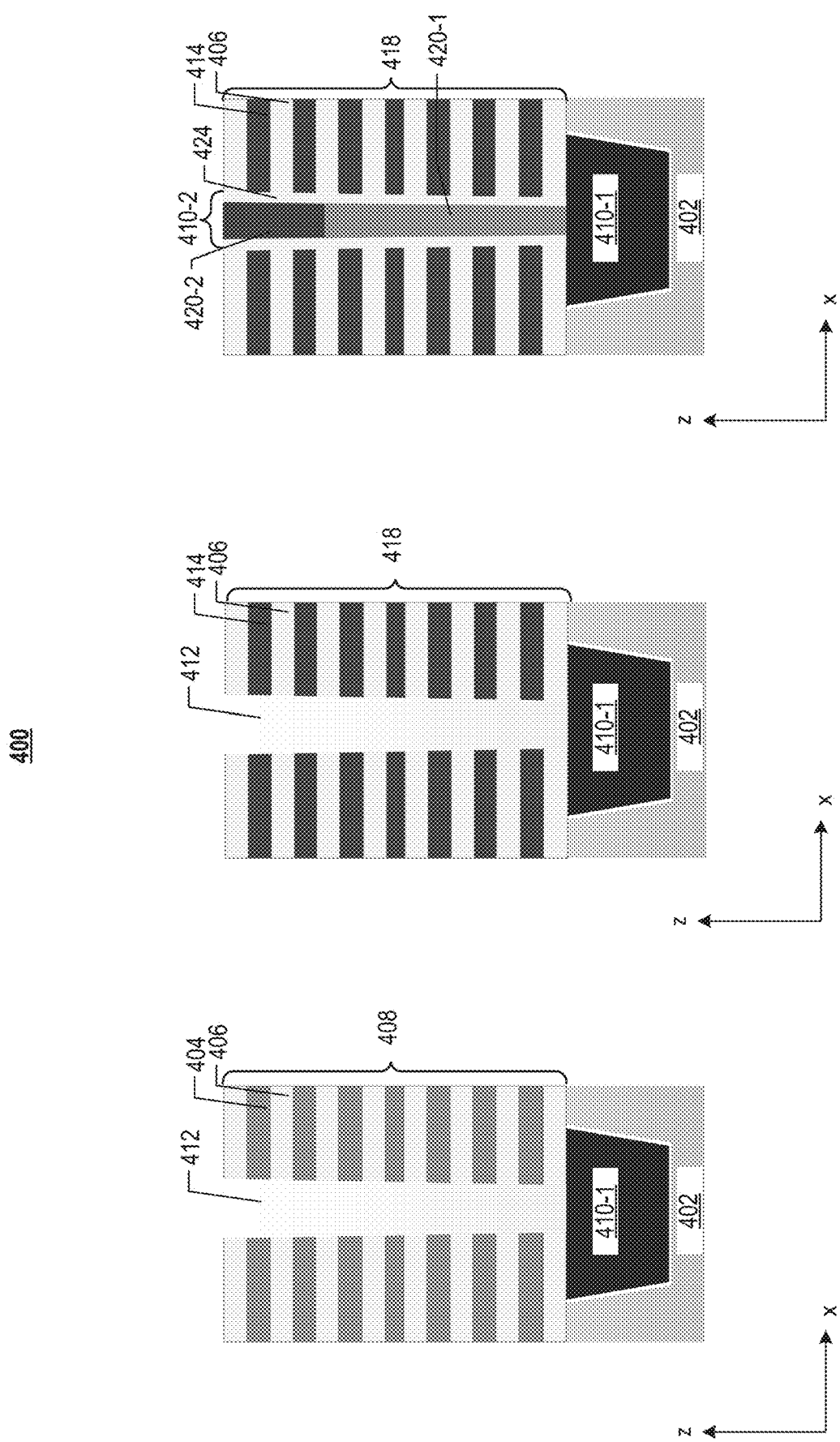

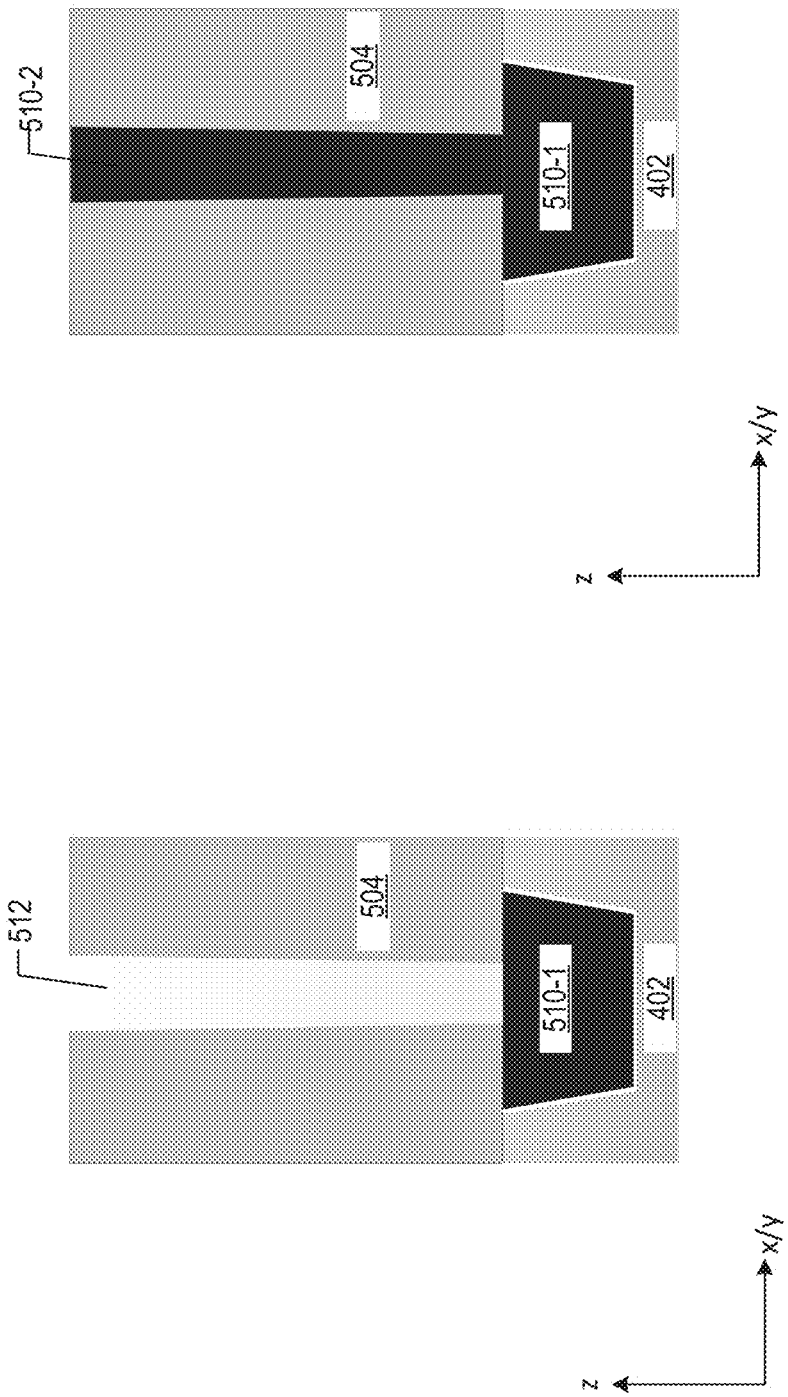

CONTACT STRUCTURES HAVING CONDUCTIVE PORTIONS IN SUBSTRATE IN THREE-DIMENSIONAL MEMORY DEVICES AND METHODS FOR FORMING THE SAME

CROSS-REFERENCE TO RELATED APPLICATIONS

This application is a divisional of U.S. application Ser. No. 16/739,681, filed on Jan. 10, 2020, entitled "CONTACT STRUCTURES HAVING CONDUCTIVE PORTIONS IN SUBSTRATE IN THREE-DIMENSIONAL MEMORY DEVICES AND METHODS FOR FORMING THE SAME," issued as U.S. Pat. No. 11,411,014, which is a continuation of International Application No. PCT/CN2019/120213, filed on Nov. 22, 2019, entitled "CONTACT STRUCTURES HAVING CONDUCTIVE PORTIONS IN SUBSTRATE IN THREE-DIMENSIONAL MEMORY DEVICES AND METHODS FOR FORMING THE SAME," both of which are hereby incorporated by reference in their entireties. This application is also related to U.S. application Ser. No. 16/739,692, filed on Jan. 10, 2020, entitled "CONTACT STRUCTURES HAVING CONDUCTIVE PORTIONS IN SUBSTRATE IN THREE-DIMENSIONAL MEMORY DEVICES AND METHODS FOR FORMING THE SAME," issued as U.S. Pat. No. 11,195,853, which is hereby incorporated by reference in its entirety.

BACKGROUND

Embodiments of the present disclosure relate to contact structures having conductive portions in substrate in three-dimensional (3D) memory devices, and methods for forming the 3D memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of contact structures having conductive portions in substrate in 3D memory devices and methods for forming the 3D memory devices are provided.

In one example, a 3D memory device includes a substrate, a memory stack on the substrate; and a source contact structure extending vertically through the memory stack. The source contact structure includes a first source contact portion in the substrate and having a conductive material different from the substrate. The source contact structure also includes a second source contact portion above, in contact with, and conductively connected to the first source contact portion.

In another example, a 3D memory device includes a substrate, a memory stack on the substrate, a memory string extending vertically through the memory stack a source contact extending vertically through the memory stack, and a metal layer in the substrate. The metal layer is in contact with and conductively connected to the source contact.

In a further example, a method for forming a 3D memory device includes forming a first source contact portion in a substrate, forming a dielectric stack over the first source contact portion, and forming a slit opening extending in the dielectric stack and exposing the first source contact portion. The method also includes forming a plurality of conductor layers through the slit opening and form a second source contact portion in the slit opening and in contact with the first source contact portion.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 4A-4C illustrate cross-sectional views of a 3D memory device having a source contact structure partially in a substrate at various stages of an exemplary fabrication process, according to some embodiments of the present disclosure.

FIGS. 5A and 5B illustrate cross-sectional views of a 3D memory device having a peripheral contact structure partially in a substrate at various stages of an exemplary fabrication process, according to some embodiments of the present disclosure.

Figure 1A:
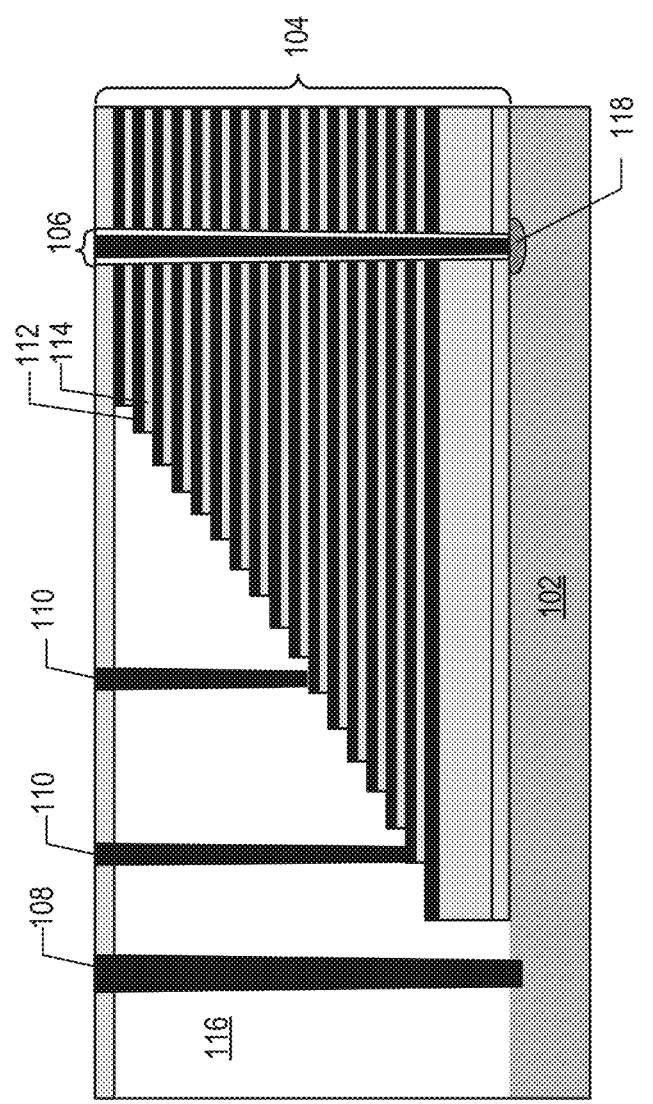
FIG. 1A illustrates a cross-sectional view of a 3D memory device having a source contact and a peripheral contact.

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the present disclosure, the term "staircase" and the term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for formation of structures over it), and a vertical direction can refer to a direction (e.g., the z-axis) perpendicular to the top surface of the structure.

NAND flash memory devices, widely used in various electronic produces, are non-volatile, light-weighted, of low power consumption and good performance. Currently, planar NAND flash memory devices have reached its storage limit. To further increase the storage capacity and reduce the storage cost per bit, 3D memory devices, e.g., 3D NAND memory devices, have been proposed. An existing 3D NAND memory device often includes a plurality of memory blocks. Adjacent memory blocks are often separated by a gate line slit (GLS) in which an array common source (ACS) contact is formed. Peripheral contacts are formed outside of the memory blocks for transmitting electrical signals around the memory blocks.

In the fabrication method to form existing 3D NAND memory devices, an increased number of levels are formed vertically to obtain higher storage capacity. The increased number of levels along the vertical direction can result in undesirably high stress on the GLS, causing deformation or even collapse of the GLS. The conductive material deposited in the GLS for forming the ACS can also impose undesirably high stress on the neighboring memory blocks, causing deformation in these regions. To reduce the susceptibility of the GLS to the high stress, connecting structures (e.g., bridges) have been formed above the substrate to support and/or conductively connect different portions of the ACS contact. However, the formation of the connecting structures can be demanding on the precision of the fabrication process, and often requires additional masks/fabrication operations, increasing the production cost.

In another aspect, peripheral contacts in the existing 3D NAND memory devices are formed by the same etching process that forms the word line contacts (e.g., the contacts that are in contact with the conductor layers/word lines). The etching to form the PC openings (i.e., openings for forming the peripheral contacts) often needs to stop on the substrate, e.g., semiconductor such as silicon, and the etching to form the WL openings (i.e., opening for forming the word line contacts) often needs to stop on the conductor layers, e.g., metal such as tungsten. Often, the PC openings are over etched to remove a portion of the substrate to improve the contact between the substrate and the subsequently-formed peripheral contacts. The over-etching and the different etch-stop materials and different etching depths of the two types of contacts can cause the conductor layers at the bottoms of the WL openings to be undesirably etched or even punched through, resulting short circuits. To reduce the possibility of punch-throughs in the openings, other approaches have been introduced. For example, instead of removing the portion of the substrate using the same etching process that forms the PC openings and the WL openings, the PC openings are not over etched and an additional etching process by a gas etchant is employed to remove the portion of the substrate at the bottoms of the PC openings. The gas etchant has a lower etch rate on the conductor layer and thus is less likely to cause punch-throughs in the conductor layers. However, the gas etchant is often erosive to the insulating material in which the WL openings are formed and can cause undesirable enlargement of the critical dimension (CD) of the WL openings. The performance of the 3D NAND memory devices can be affected.

Figure 1B:
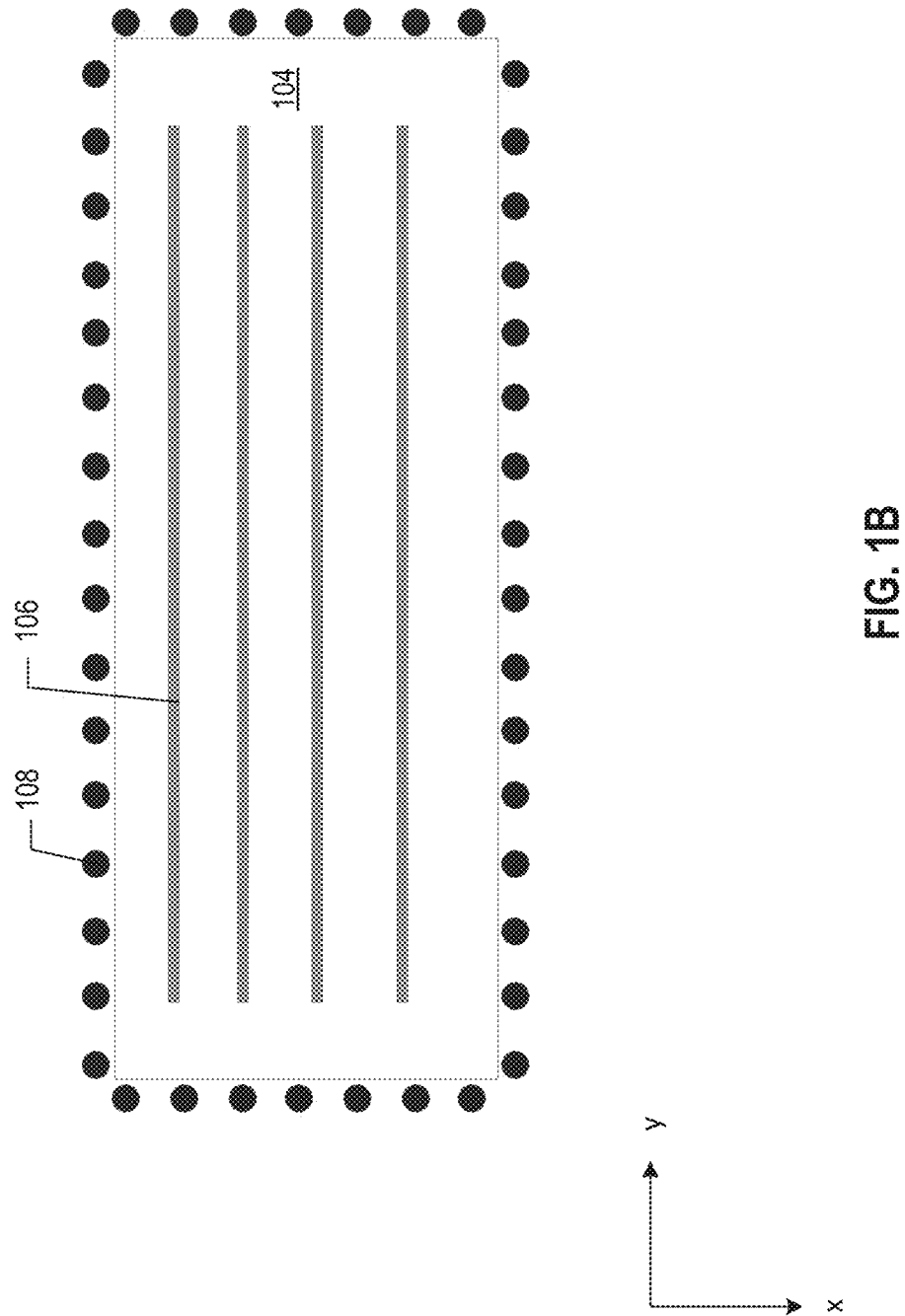
FIG. 1B illustrates a top view of the 3D memory device shown in FIG. 1A.

FIG. 1A illustrates a cross-sectional view of an existing 3D NAND memory device 100 having a source contact and a peripheral contact. FIG. 1B illustrates a top view of 3D NAND memory device 100. As shown in FIG. 1A, 3D NAND memory device 100 includes an insulating structure 116 over a substrate 102, a memory stack 104 in insulating structure 116 and over a substrate 102, a source contact 106 (e.g., ACS contact) extending vertically through memory stack 104, and a doped region 118 in substrate 102. Memory stack 104 includes interleaved a plurality of conductor layers 112 and a plurality of insulating layers 114. 3D NAND memory device 100 also includes a peripheral contact 108 extending vertically through insulating structure 116 and in contact with substrate 102, and a word line contact 110 extending through insulating structure 116 and in contact with conductor layers 112. As shown in FIG. 1A, doped region 118 is in contact with source contact 106 and substrate 102, providing a conductive connection in between. Peripheral contact 108 extends into substrate 102, forming conductive connection with substrate 102. As shown in FIG. 1B, source contact 106 extends laterally in memory stack 104, dividing memory cells in memory stack 104 into a plurality of fingers. Peripheral contacts 108 are located outside of memory stack 104.

The present disclosure provides a 3D memory device (e.g., 3D NAND memory device) having conductive portions formed in the substrate to solve the aforementioned issues in existing 3D memory devices. The conductive portions may be referred to as being formed in a "zero layer." The conductive portions may include a suitable conductive material such as tungsten, cobalt, copper, aluminum, silicides, and/or polysilicon. In some embodiments, the conductive portions include tungsten. In some embodiments, a conductive portion may be a part (e.g., a first source contact portion) of a source contact structure, which also has another part (e.g., a second source contact portion) above and in contact with the conductive portion. The conductive portion may extend continuously in the substrate, while the upper portion of the source contact structure may include a plurality of disconnected sub-source contacts. The conductive portion may be in contact with and conductively connected to the disconnected sub-source contacts, allowing the disconnected sub-source contacts to be conductively connected without any connecting structures being formed above the substrate. The stress imposed by the source contact structure can thus be reduced by the formation of the sub-source contacts and the fabrication process of the 3D memory device can be simplified. In some embodiments, the conductive portion improves the conductivity (e.g., reduces resistance) between the second source contact portion and the substrate compared to a doped region in existing 3D NAND memory device (e.g., doped region 118 in 3D NAND memory device 100).

In some embodiments, a conductive portion may be a part (e.g., a first peripheral contact portion) of a peripheral contact structure, which also has another part (e.g., a second peripheral contact portion) above and in contact with the conductive portion. The conductive portion may extend in the substrate and in contact with the substrate and/or any other peripheral contact structures. In this example, the PC openings do not need to be over etched for forming the contact between the peripheral contact structures and the substrate, while the contact area between each peripheral contact structure and the substrate can be increased. Desirably low contact resistance can be obtained between the substrate and the peripheral contact structures. The CD of word line contacts can be maintained. The performance of the 3D memory device can thus be improved and the fabrication process can be simplified. In some embodiments, the conductive portions for forming the source contact structures and the peripheral contact structures are formed in the same fabrication operations, further simplifying the fabrication process of the 3D memory device.

Figure 2A:
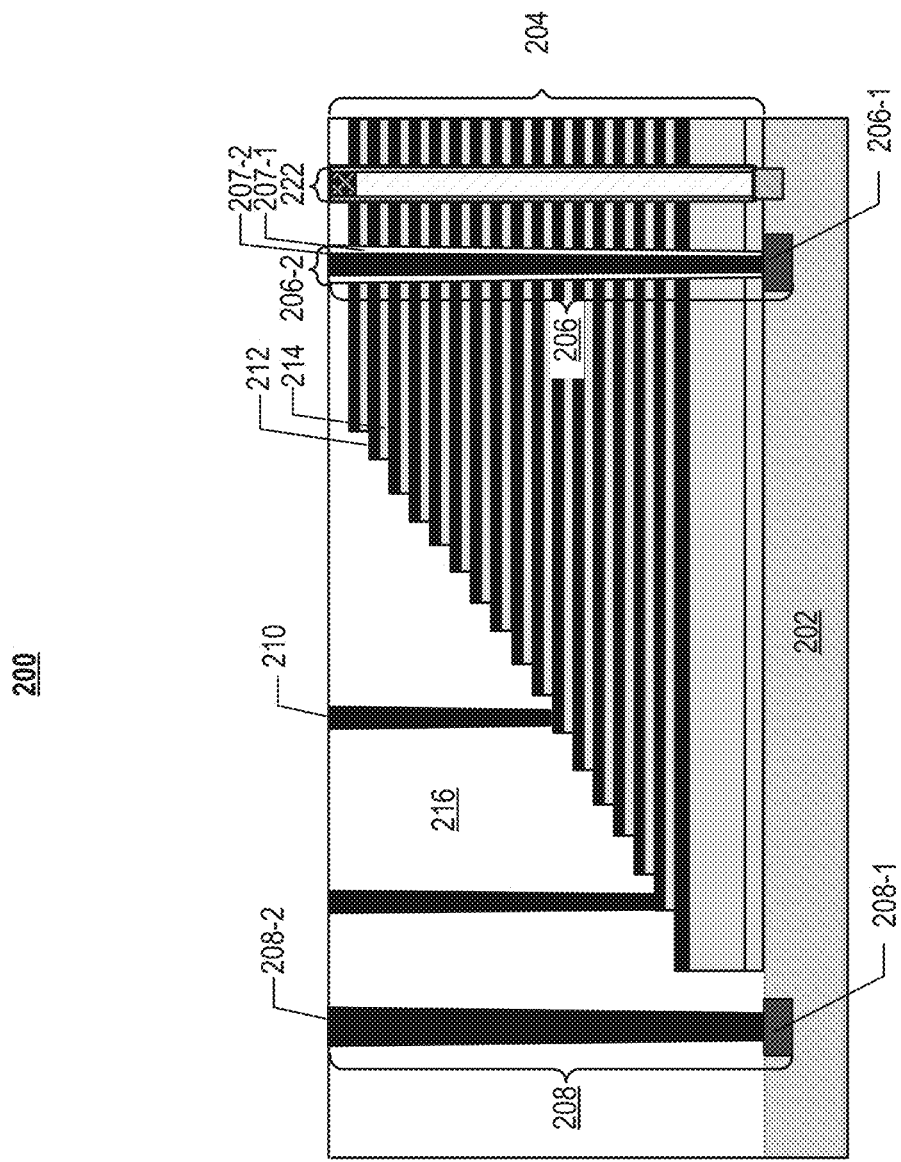
FIG. 2A illustrates a cross-sectional view of an exemplary 3D memory device having a source contact structure and a peripheral contact structure, according to some embodiments of the present disclosure.
Figure 2B:
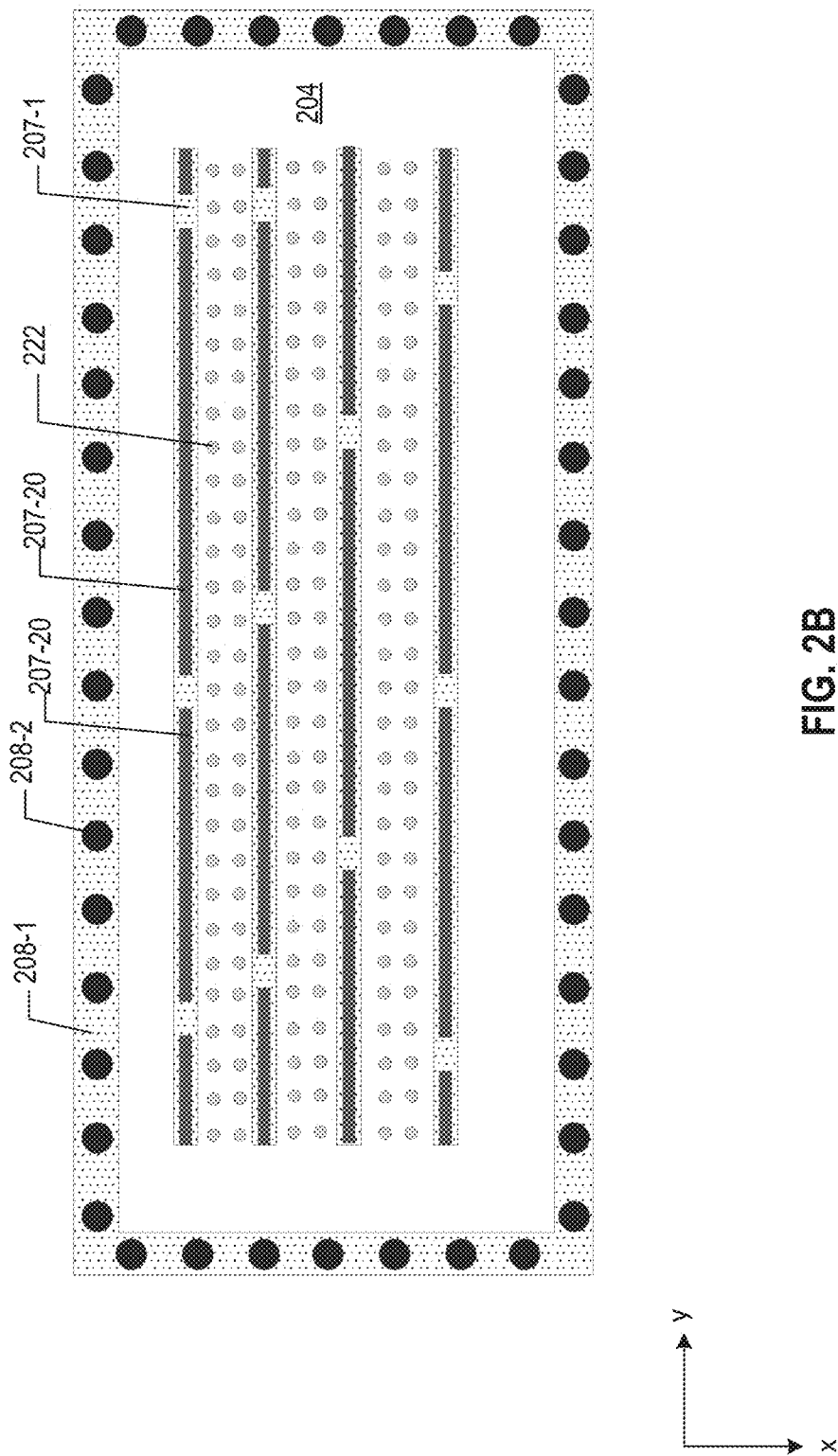
FIG. 2B illustrates a top view of the exemplary 3D memory device shown in FIG. 2A, according to some embodiments of the present disclosure.

FIGS. 2A and 2B illustrate views of an exemplary 3D memory device 200 having a source contact structure and a peripheral contact structure, each having a conductive portion in the substrate, according to some embodiments. Specifically, FIG. 2A illustrates a cross-sectional view of 3D memory device 200 along the x-z plane, and FIG. 2B illustrates a top view of 3D memory device 200 along the x-y plane. As shown in FIG. 2A, 3D memory device 200 may include a substrate 202 and a memory stack 204 over substrate 202. Memory stack 204 may include interleaved a plurality of conductor layers 212 and a plurality of dielectric layers 214. 3D memory device 200 may also include an insulating structure 216 in which memory stack 204 is located. 3D memory device 200 may further include one or more channel structures 222 each extending vertically through memory stack 204 (e.g., along the z-axis), one or more source contact structures 206 each extending vertically through memory stack 204, one or more peripheral contact structures 208 each extending vertically through insulating structure 216, and one or more word line contacts 210 each extending vertically in insulating structure 216 and in contact of a respective conductor layer 212. In some embodiments, source contact structure 206 each include a first source contact portion 206-1 embedded in substrate 202 and a second source contact portion 206-2 above, in contact with, and conductively connected to first source contact portion 206-1. In some embodiments, peripheral contact structure 208 includes a first peripheral contact portion 208-1 embedded in substrate 202 and a second peripheral contact portion 208-2 above, in contact with, and conductively connected to first peripheral contact portion 208-1.

Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a thinned substrate (e.g., a semiconductor layer), which was thinned by grinding, etching, chemical mechanical polishing (CMP), or any combination thereof. In some embodiments, substrate 202 includes silicon.

Memory stack 204 may include a plurality of interleaved conductor layers 212 and dielectric layers 214. The intersection of channel structures 222 and conductor layers 212 may form a plurality of memory cells, e.g., an array of memory cells, in 3D memory device 200. The number of the conductor/dielectric layer pairs in memory stack 204 (e.g., 32, 64, 96, or 128) determines the number of memory cells in 3D memory device 200. Conductor layers 212 and dielectric layers 214 may alternate in the vertical direction (e.g., the z-direction). In other words, except for the ones at the top or bottom of memory stack 204, each conductor layer 212 can be adjoined by two dielectric layers 214 on both sides, and each dielectric layer 214 can be adjoined by two conductor layers 212 on both sides. Conductor layers 212 can each have the same thickness or have different thicknesses. Similarly, dielectric layers 214 can each have the same thickness or have different thicknesses. Each word line contact 210 may extend in insulating structure 216 and be in contact with the respective conductor layer 212, conductively connecting conductor layer 212 with, e.g., a peripheral circuit. Conductor layers 212 and word line contacts 210 can each include conductor materials including, but not limited to, tungsten (W), cobalt (Co), copper (Cu), aluminum (Al), polycrystalline silicon (polysilicon), doped silicon, silicides, or any combination thereof. Dielectric layers 214 can include dielectric materials including, but not limited to, silicon oxide, silicon nitride, silicon oxynitride, or any combination thereof. In some embodiments, conductor layers 212 include metal layers, such as W, and dielectric layers 214 include silicon oxide.

Channel structures 222 may form an array and may each extend vertically above substrate 202. Channel structure 222 can include a semiconductor channel extending vertically through the alternating conductor/dielectric stack. Channel structure 222 can include a channel hole filled with a channel-forming structure of a plurality of channel-forming layers, e.g., dielectric materials (e.g., as a memory film) and semiconductor materials (e.g., as a semiconductor layer). In some embodiments, the memory film is a composite layer including a tunneling layer, a memory layer (also known as a "charge trap layer"), and a blocking layer. The remaining space of the channel hole can be partially or fully filled with a dielectric core including dielectric materials, such as silicon oxide. Channel structure 222 can have a cylindrical shape (e.g., a pillar shape) or a trapezoid shape through memory stack 204. The dielectric core, semiconductor layer, the tunneling layer, the memory layer, and the blocking layer are arranged radially from the center toward the sidewall in this order, according to some embodiments. The semiconductor layer can include silicon, such as amorphous silicon, polysilicon, and/or single crystalline silicon. The tunneling layer can include silicon oxide, silicon oxynitride, or any combination thereof. The memory layer can include silicon nitride, silicon oxynitride, silicon, or any combination thereof. The blocking layer can include silicon oxide, silicon oxynitride, high dielectric constant (high-k) dielectrics, or any combination thereof. In one example, the memory layer can include a composite layer of silicon oxide/silicon oxynitride (or silicon nitride)/silicon oxide (ONO).

In some embodiments, channel structure 222 further includes a conductive plug (e.g., a semiconductor plug) in the lower portion (e.g., at the lower end of) of channel structure 222. As used herein, the "upper end" of a component (e.g., channel structure 222) is the end farther away from substrate 202 in the vertical direction, and the "lower end" of the component (e.g., channel structure 222) is the end closer to substrate 202 in the vertical direction when substrate 202 is positioned in the lowest plane of 3D memory device 200. The conductive plug can include a semiconductor material, such as silicon, which is epitaxially grown (e.g., using selective epitaxial growth) from substrate 202 or deposited onto substrate 202 in any suitable directions. It is understood that in some embodiments, the conductive plug includes single crystalline silicon, the same material as substrate 202. In other words, the conductive plug can include an epitaxially-grown semiconductor layer grown from substrate 202. The conductive plug can also include a different material than substrate 202. In some embodiments, the conductive plug includes at least one of silicon, germanium, and silicon germanium. In some embodiments, part of the conductive plug is above the top surface of substrate 202 and in contact with the semiconductor channel. The conductive plug may be conductively connected to the semiconductor channel. In some embodiments, a top surface of the conductive plug is located between a top surface and a bottom surface of a bottom dielectric layer 214 (e.g., the dielectric layer at the bottom of memory stack 204).

In some embodiments, channel structure 222 further includes a drain structure (e.g., channel plug) in the upper portion (e.g., at the upper end) of channel structure 222. The drain structure can be in contact with the upper end of the semiconductor channel and may be conductively connected to the semiconductor channel. The drain structure can include semiconductor materials (e.g., polysilicon) or conductive materials (e.g., metals). In some embodiments, the drain structure includes an opening filled with Ti/TiN or Ta/TaN as an adhesion layer and tungsten as a conductor material. By covering the upper end of the semiconductor channel during the fabrication of 3D memory device 200, the drain structure can function as an etch stop layer to prevent etching of dielectrics filled in the semiconductor channel, such as silicon oxide and silicon nitride.

In some embodiments, source contact structure 206 extends vertically through memory stack 104 and is in contact with substrate 202. In some embodiments, first source contact portion 206-1 may be embedded in substrate 202 and second source contact portion 206-2 may be above, in contact with, and conductively connected to first source contact portion 206-1. Specifically, a bottom surface of first source contact portion 206-1 is below the top surface of substrate 202 and a top surface of first source contact portion 206-1 is coplanar with the top surface of substrate 202. As shown in FIG. 2A, second source contact portion 206-2 may be in contact with first source contact portion 206-1 at an interface (or the top surface of first source contact portion 206-1) that is coplanar with the top surface of substrate 202.

FIG. 2B illustrates a layout of source contact structures 206 in memory stack 204. As shown in FIG. 2B, source contact structures 206 may extend laterally in memory stack 204, e.g., along the y-axis, dividing memory cells in memory stack 204 into a plurality of fingers. A plurality of channel structures 222 may be distributed in each finger. Specifically, for each source contact structure 206, first source contact portion 206-1 may extend continuously along the lateral direction (e.g., they-axis). Along the lateral direction (e.g., y-axis), a length of first source contact portion 206-1 may be nominally equal to a length of second source contact portion 206-2. In some embodiments, first source contact portion 206-1 includes a conductive material such as tungsten, cobalt, aluminum, copper, silicides, polysilicon, or any combination thereof. In some embodiments, first source contact portion 206-1 includes an adhesive layer, e.g., Ti/TiN and/or Ta/TaN between the conductive material and substrate 202. Along the x-axis, a lateral width of first source contact portion 206-1 may be equal to or greater than a lateral width of second source contact portion 206-2. In some embodiments, the lateral width of first source contact portion 206-1 (e.g., along the x-axis) is unchanged as first source contact portion 206-1 extends along they-axis.

Referring back to FIG. 2A, second source contact portion 206-2 may include an insulating spacer 207-1 and a contact 207-2 in insulating spacer 207-1. Contact 207-2 may be in contact with and conductively connected to first source contact portion 206-1, e.g., the conductive material of first source contact portion 206-1 such that a source voltage can be applied to the memory cells through first and second source contact portions 206-1 and 206-2. Referring back to FIG. 2B, contact 207-2 may include a plurality of disconnected sub-contacts 207-20, each being disconnected from one another (e.g., by insulating spacers 207-1) along the y-axis. In some embodiments, each sub-contact 207-20 is in contact with and conductively connected to first source contact portions 206-1, e.g., the conductive material of first source contact portion 206-1. In some embodiments, because contact 207-2 is divided into a plurality of sub-contacts 207-20, each of which having a length (e.g., along the y-axis) less than the total length of second source contact portion 206-2 (or an existing source contact 106), the stress caused by the conductive material in each sub-contact 207-20 can be reduced in 3D memory device 200. 3D memory device 200 is then less susceptible to deformation caused by the deposition of conductive materials.

Insulating spacer 207-1 may include a dielectric material such as silicon oxide, silicon nitride, and/or silicon oxynitride. Contact 207-2 may include a conductive material such as tungsten, cobalt, aluminum, copper, silicides, polysilicon, or any combination thereof. In some embodiments, the conductive material(s) in first and second source contact portions 206-1 and 206-2 may be the same or different. In some embodiments, first source contact portion 206-1 includes a metal (e.g., tungsten). In some embodiments, second source contact portion 206-2 (or contact 207-2) includes polysilicon and a metal (e.g., tungsten) over the polysilicon, where the polysilicon is in contact with the conductive material (e.g., tungsten) in first source contact portion 206-1.

Referring back to FIG. 2A, 3D memory device 200 also includes one or more peripheral contact structures 208 extending vertically through insulating structure 216 and in contact with substrate 202. Peripheral contact structure 208 may be conductively connected to substrate 202 and a peripheral circuit (not shown) for applying a voltage on substrate 202. Peripheral contact structure 208 may include a first peripheral contact portion 208-1 embedded in substrate 202 and a second peripheral contact portion 208-2 above, in contact with, and conductively connected to first peripheral contact portion 208-1. Specifically, a bottom surface of first peripheral contact portion 208-1 is below the top surface of substrate 202 and a top surface of first peripheral contact portion 208-1 is coplanar with the top surface of substrate 202. As shown in FIG. 2A, second peripheral contact portion 208-2 may be in contact with first peripheral contact portion 208-1 at an interface (or the top surface of first peripheral contact portion 208-1) that is coplanar with the top surface of substrate 202.

FIG. 2B illustrates a layout of peripheral contact structures 208 in memory stack 204. As shown in FIG. 2B, peripheral contact structures 208 may be distributed outside of memory stack 204, e.g., along the x-axis and/or the y-axis, and in contact with substrate 202. Examples of peripheral contact structure 208 may include a through-array-contact (TAC), a contact of peripheral circuits/devices, or any suitable contact that meets the description of (i) being distributed outside of memory stack 204 and (ii) being in contact with substrate 202. One first peripheral contact portion 208-1 may be separated/insulated from other first peripheral contact portions 208-1, or in contact with and conductively connected to another first peripheral contact portion 208-1, depending on the design of 3D memory device 200. The shaded area in FIG. 2B is for illustrating the distribution of first peripheral contact portions 208-1 only and is not meant to indicate the shape, dimensions, or conductive connection of first peripheral contact portions 208-1. In some embodiments, a dimension (e.g., length or width) of first peripheral contact portion 208-1 may be equal to or greater than the dimension (e.g., length or width) of the respective second peripheral contact portion 208-2 along the same lateral direction. For example, the length/width of first peripheral contact portion 208-1 may be at least the same as the length/width of the respective second peripheral contact portion 208-2 along the x-axis. In some embodiments, the lateral cross-sectional area of first peripheral contact portion 208-1 (e.g., along the x-y plane) is equal to or greater than the lateral cross-sectional area of the respective second peripheral contact portion 208-2 (e.g., along the x-y plane). In some embodiments, first peripheral contact portion 208-1 includes a conductive material such as tungsten, cobalt, aluminum, copper, silicides, polysilicon, or any combination thereof. In some embodiments, first peripheral contact portion 208-1 includes an adhesive layer, e.g., Ti/TiN and/or Ta/TaN between the conductive material and substrate 202.

In some embodiments, second peripheral contact portion 208-2 includes a conductive material, which can be the same as or different from the conductive material in the respective first peripheral contact portion 208-1. For example, second peripheral contact portion 208-2 can include tungsten, cobalt, aluminum, copper, silicides, polysilicon, or any combination thereof. In some embodiments, second peripheral contact portion 208-2 and the respective first peripheral contact portion 208-1 include the same conductive material, e.g., tungsten. In some embodiments, second peripheral contact portion 208-2 further includes an adhesion layer e.g., Ti/TiN and/or Ta/TaN between the conductive material and insulating structure 216. The adhesion layer may surround the conductive material in second peripheral contact portion 208-2 and be in contact with the conductive material in first peripheral contact portion 208-1.

In some embodiments, first source contact portion 206-1 and first peripheral contact portion 208-1 each include a metal material, such as tungsten. First source contact portion 206-1 and first peripheral contact portion 208-1 may thus each be referred to as a "metal layer." Second source contact portion 206-2 may also be described as a source contact and second peripheral contact portion 208-2 may also be described as a peripheral contact. Accordingly, source contact structure 206 may be equivalent to a source contact in contact with a respective metal layer, and peripheral contact structure 208 may be equivalent to a peripheral contact in contact with a respective metal layer.

It should be noted that, for ease of illustration, source contact structure and peripheral contact structure each having a first contact portion (e.g., conductive portion) in the substrate are illustrated in the same figures, e.g., FIGS. 2A and 2B. In various embodiments, the source contact structure and the peripheral contact structure may not be formed in the same 3D memory device. Also, other structures, such as contact structures, that are conductively connected to the substrate may also be formed to include a conductive portion in the substrate as described above, when applicable. The specific type of structure that includes a conductive portion in the substrate, e.g., to provide a conductive connection between the structure and the substrate, should not be limited by the embodiments of the present disclosure.

Figure 3A:
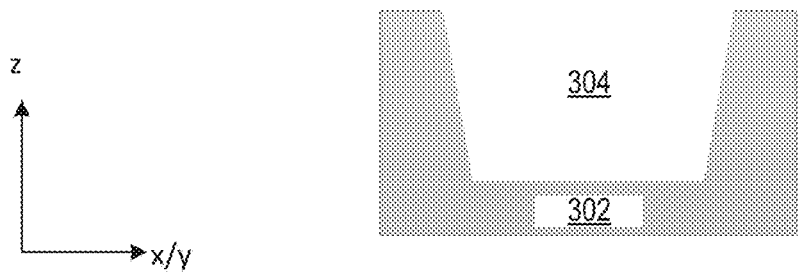
FIGS. 3A-3C illustrate cross-sectional views of a conductive portion at various stages of an exemplary fabrication process, according to some embodiments of the present disclosure.
Figure 3B:
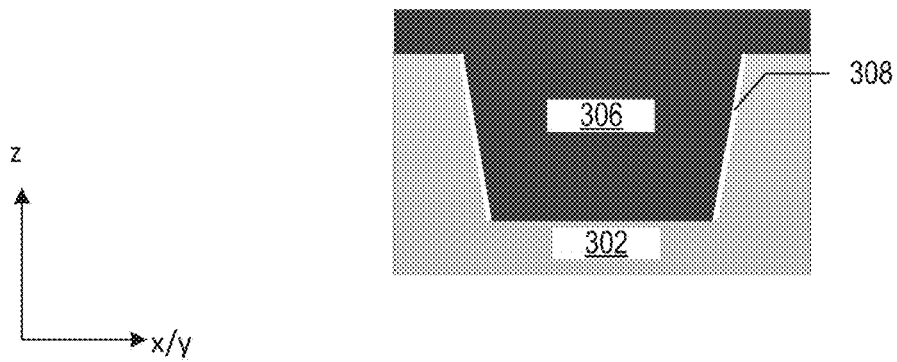
Figure 3C:
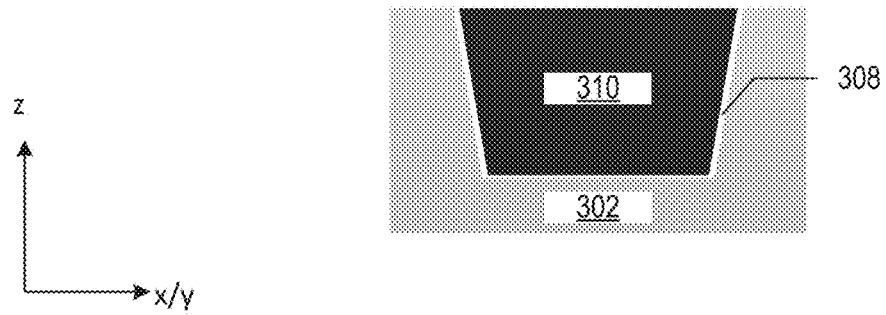
Figure 6:
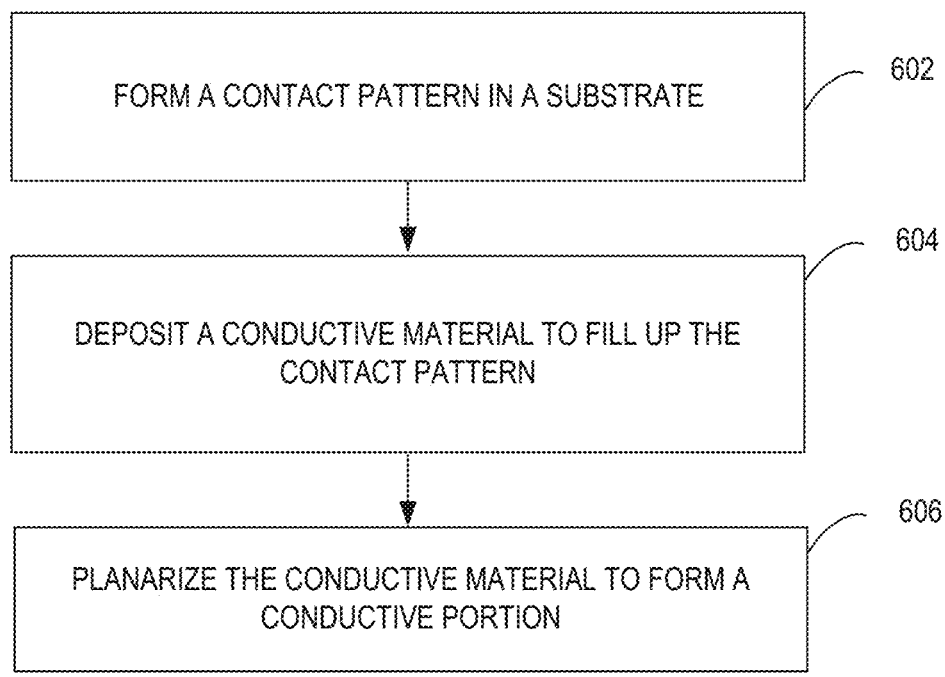
FIG. 6 illustrates a flowchart of an exemplary fabrication process for forming a conductive portion in a substrate, according to some embodiments of the present disclosure.

FIGS. 3A-3C illustrate cross-sectional views of a 3D memory device at various stages of an exemplary fabrication method 300 for forming a conductive portion in a substrate, according to some embodiments. The conductive portion may include or be employed as a first source contact portion or a first peripheral contact portion described in FIGS. 2A and 2B. FIG. 6 illustrates a flowchart 600 of method 300, according to some embodiments. It is understood that the operations shown in method 300 are not exhaustive and that other operations can be performed as well before, after, or between any of the illustrated operations. Further, some of the operations may be performed simultaneously, or in a different order than shown in FIGS. 3 and 6. Method 300 may also be employed to form other contact portions in the substrate (if any).

At the beginning of the process, a contact pattern is formed in a substrate (Operation 602). FIG. 3A illustrates a corresponding structure.

As shown in FIG. 3A, a contact pattern 304 may be formed in a substrate 302. In some embodiments, contact pattern 304 includes a source contact pattern and/or a peripheral contact pattern. A source contact pattern may extend continuously along a lateral direction, e.g., the y-axis, and have a length of a respective source contact structure (e.g., source contact structure 206). The peripheral contact pattern may extend continuously in an area in which one or more peripheral contact structures are to be formed and conductively connected. For example, the peripheral contact pattern may extend continuously along one or more lateral directions (e.g., the x-axis and/or the y-axis). The source contact pattern and the peripheral contact pattern (and other contact patterns) may be formed separately or simultaneously. In some embodiments, the source contact pattern and the peripheral contact pattern (and any other contact patterns) are formed by the same patterning process.

Contact pattern 304 may be formed by patterning substrate 302 using an etch mask and an etching process. For example, a patterned photoresist layer may be formed over substrate 302, exposing portions of substrate 302 corresponding to the source contact pattern and/or the peripheral contact pattern. A suitable etching process such as anisotropic etching process (e.g., dry etch) and/or isotropic etching process (e.g., wet etch) can be performed to remove the exposed portions of substrate 302, forming contact pattern 304. A bottom surface of contact pattern 304 may be below the top surface of substrate 302.

Referring back to FIG. 6, after the formation of the contact pattern, method 300 proceeds to Operation 604, in which a conductive material is deposited to fill up the contact pattern. FIG. 3B illustrates a corresponding structure.

As shown in FIG. 3B, a conductive material 306 is deposited to fill up contact pattern 304. In some embodiments, an adhesive layer 308 is deposited over the sidewall of contact pattern 304 (e.g., the sidewall of the source contact pattern and/or the sidewall of the peripheral contact pattern). In some embodiments, conductive material 306 includes tungsten, and adhesive layer 308 includes TiN. The deposition of conductive material 306 and adhesive layer 308 may each include ALD, CVD, and/or PVD.

Referring back to FIG. 6, after the deposition of the conductive material, method 300 proceeds to Operation 606, in which the conductive material is planarized to form a conductive portion. FIG. 3C illustrates a corresponding structure.

As shown in FIG. 3C, conductive material 306 and any adhesive layer 308 are planarized. A conductive portion 310 is formed from the planarized conductive material 306. The planarized conductive portion 310 and any adhesive layer 308, may include a first source contact portion (e.g., 206-1) and/or a first peripheral contact portion (e.g., 208-1). Conductive portion 310 may also include other contact portions, if any. The planarization process may include CMP and/or recess etch (e.g., dry etch and/or wet etch).

Figure 7:
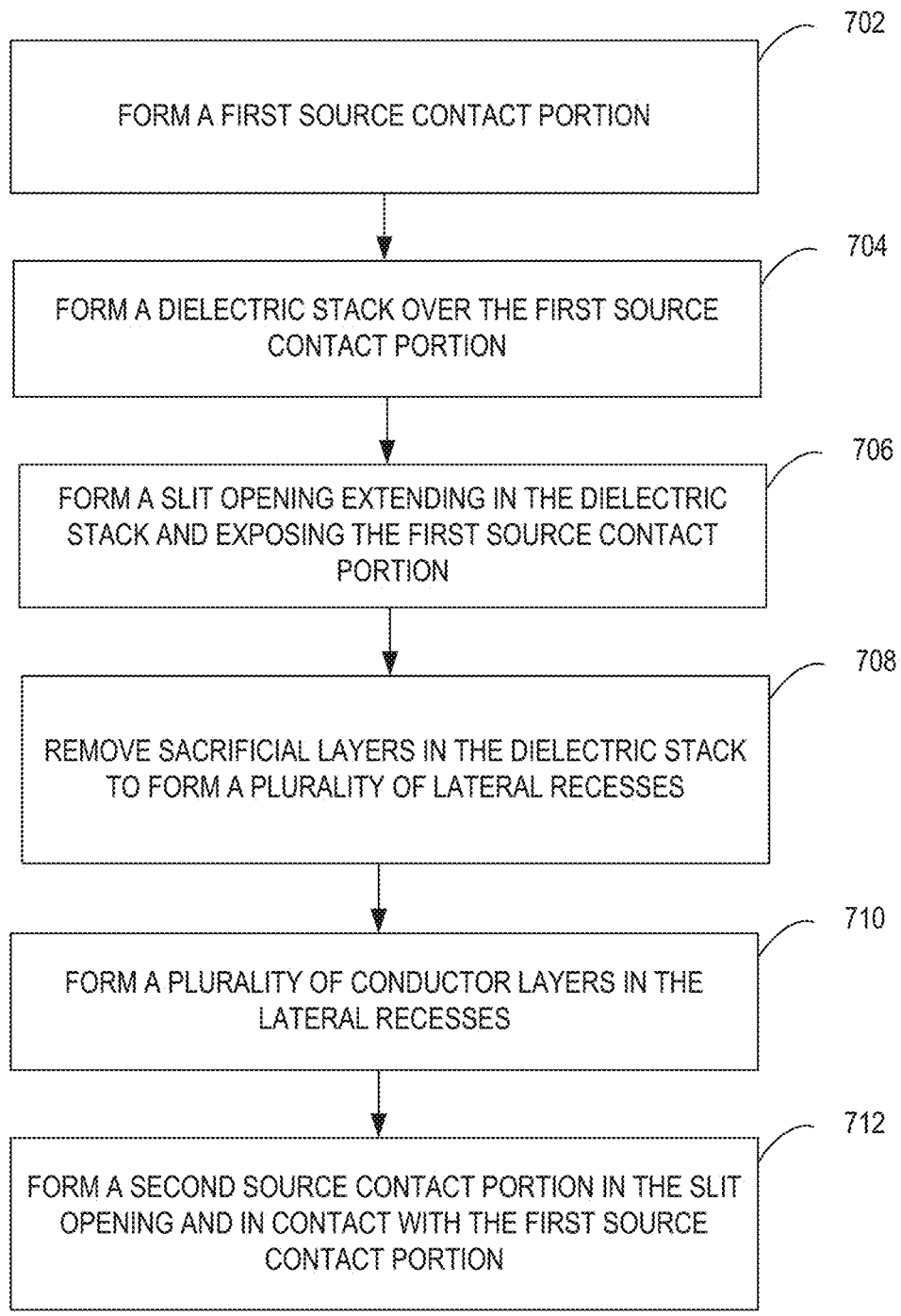
FIG. 7 illustrates a flowchart of an exemplary fabrication process for forming a 3D memory device having a source contact structure, according to some embodiments of the present disclosure.

FIGS. 4A-4C illustrate cross-sectional views of a 3D memory device at various stages of an exemplary fabrication method 400 for forming a source contact structure, according to some embodiments. The source contact structure may be similar to or the same as source contact structure 206 described in FIGS. 2A and 2B. FIG. 7 illustrates a flowchart 700 of method 400, according to some embodiments. It is understood that the operations shown in method 400 are not exhaustive and that other operations can be performed as well before, after, or between any of the illustrated operations. Further, some of the operations may be performed simultaneously, or in a different order than shown in FIGS. 4 and 7.

At the beginning of the process, a first source contact portion is formed in a substrate (Operation 702). FIG. 4A illustrates a corresponding structure.

As shown in FIG. 4A, a first source contact portion 410-1 may be formed in a substrate 402. The description of the formation of first source contact portion 410-1 can be referred to the description of the conductive portion illustrated in FIGS. 3A-3C, and the detailed description is not repeated herein.

Referring back to FIG. 7, after the formation of the first source contact portion, method 300 proceeds to Operation 704, in which a dielectric stack is formed over the first source contact portion. FIG. 4A illustrates a corresponding structure.

As shown in FIG. 4A, a dielectric stack 408 may be formed over substrate 402, covering first source contact portion 410-1. As shown in FIG. 4A, dielectric stack 408 may be formed over substrate 402 by alternatingly depositing sacrificial layers 404 and dielectric layers 406 over substrate 402. Sacrificial layers 404 and dielectric layers 406 may have different etching selectivities during the subsequent gate-replacement process. In some embodiments, sacrificial layers 404 and dielectric layers 406 include different materials. In some embodiments, sacrificial layers 404 include silicon nitride and dielectric layers 406 include silicon oxide. The deposition of sacrificial layers 404 and dielectric layers 406 may each include one or more of CVD, PVD, and ALD.

In some embodiments, dielectric stack 408 may have a staircase structure, e.g., in the staircase region of dielectric stack 408. The staircase structure can be formed by repetitively etching the plurality of interleaved sacrificial layers 404 and dielectric layers 406 using an etch mask, e.g., a patterned PR layer over dielectric stack 408. Each sacrificial layer 404 and the underlying dielectric layer 406 may be referred to as a dielectric pair. In some embodiments, one or more dielectric pairs can form one level/stair. During the formation of the staircase structure, the PR layer is trimmed (e.g., etched incrementally and inwardly from the boundary of the memory stack, often from all directions) and used as the etch mask for etching the exposed portion of dielectric stack 408. The amount of trimmed PR can be directly related (e.g., determinant) to the dimensions of the staircases. The trimming of the PR layer can be obtained using a suitable etch, e.g., an isotropic dry etch such as a wet etch. One or more PR layers can be formed and trimmed consecutively for the formation of the staircase structure. Each dielectric pair can be etched, after the trimming of the PR layer, using suitable etchants to remove a portion of both sacrificial layer 404 and the underlying dielectric layer 406. The etched sacrificial layers 404 and dielectric layers 406 may form stairs in dielectric stack 408. The PR layer can then be removed.

Referring back to FIG. 7, after the formation of the dielectric stack, method 300 proceeds to Operation 706, in which a slit opening is formed extending in the dielectric stack and exposing the first source contact portion. FIG. 4A illustrates a corresponding structure.

As shown in FIG. 4A, a slit opening 412 is formed in dielectric stack 408. Slit opening 412 may expose first source contact portion 410-1. In some embodiments, slit opening 412 may extend continuously along the lateral direction first source contact portion 410-1 extends, e.g., the y-axis. In some embodiments, along the x-axis, a lateral dimension of slit opening 412 is less than or equal to a lateral dimension of first source contact portion 410-1. In some embodiments, slit opening 412 is formed by patterning dielectric stack 408 using an etch mask (e.g., a patterned photoresist layer) and a suitable etching process (e.g., dry etch).

Referring back to FIG. 7, after the formation of the slit opening, method 300 proceeds to Operations 708 and 710, in which the sacrificial layers in the dielectric stack are removed to form a plurality of lateral recesses and a plurality of conductor layers are formed in the lateral recesses. FIG. 4B illustrates a corresponding structure.

As shown in FIG. 4B, a plurality of conductor layers 414 are formed in the lateral recesses through slit opening 412. In some embodiments, sacrificial layers 404 in contact with slit opening 412 are removed through slit opening. The removal of sacrificial layers 404 may include an isotropic etching process, e.g., wet etch. A plurality of lateral recesses may be formed in dielectric stack 408, according to operation 708. Further, according to operation 710, a conductor material may then be deposited to fill in the lateral recesses, forming a plurality of conductor layers 414 in dielectric stack 408. In some embodiments, the conductor material is deposited by at least one of CVD, PVD, and ALD. Conductor layers 414 and dielectric layers 406 may be arranged alternatingly along the z-axis above substrate 402, and a memory stack 418 may be formed from dielectric stack 408.

Referring back to FIG. 7, after the formation of the conductor layers, method 300 proceeds to Operation 712, in which a second contact portion is formed in the slit opening in contact with the first source contact portion. FIG. 4C illustrates a corresponding structure.

As shown in FIG. 4C, a second source contact portion 410-2 may be formed in slit opening 412. Second source contact portion 410-2 may be in contact with and conductively connected to first source contact portion 410-1. In some embodiments, second source contact portion 410-2 includes an insulating spacer 424 and a contact 420 in insulating spacer 424. In some embodiments, contact 420 includes a single conductive material such as tungsten. In some embodiments, contact 420 may include a lower portion 420-1 and an upper portion 420-2 over lower portion 420-1, each having a different conductive material. In some embodiments, lower portion 420-1 includes polysilicon and upper portion 420-2 includes tungsten.

In some embodiments, contact 420 includes a plurality of sub-contacts disconnected from one another along the direction it extends (e.g., the y-axis). In some embodiments, each sub-contact is insulated from one another by insulating spacer 424. Contact 420 and insulating spacer 424 may be formed in various ways. In some embodiments, insulating spacer 424 is formed by depositing a suitable dielectric material, such as silicon oxide, in slit opening 412 to divide slit opening 412 into a plurality of slit portions along the y-axis. Insulating spacer 424 may cover the sidewall of slit opening 412 and expose first source contact portion 410-1. In an example, the dielectric material is deposited to fill up slit opening 412 and subsequently patterned, e.g., using a patterning process, to remove portions of the dielectric material and form the slit portions. One or more conductive materials may be deposited, e.g., sequentially, to form contact 420 (or the sub-contacts). Second source contact portion 410-2 may then be formed in contact with first source contact portion 410-1, forming source contact structure 410.

In some embodiments, the dielectric material is deposited to cover the sidewall of slit opening 412, and a recess etching process is performed to remove a portion of the dielectric material at the bottom of slit opening 412 to expose substrate 402. One or more conductive materials may be deposited, e.g., sequentially, into slit opening 412 to fill up the space surrounded by the dielectric material. In some embodiments, the deposited conductive material(s) and dielectric material may then be patterned to form one or more openings along the y-axis, separating the conductive material(s) into a plurality of sub-contacts. A suitable insulating material, e.g., the dielectric material, may then be deposited to fill up the openings and insulate the sub-contacts from one another. Second source contact portion 410-2 may then be formed in contact with first source contact portion 410-1, forming source contact structure 410.

In various embodiments, the depositions of the conductive materials include CVD, PVD, and/or ALD, and the depositions of the dielectric material includes CVD, PVD, and/or ALD. The patterning of the dielectric material may include a suitable etching process such as a dry etching process and/or a wet etching process. The recess etch of the dielectric material may include a suitable etching process such as a dry etching process and/or a wet etching process. In some embodiments, a planarization process, e.g., CMP and/or recess etch, is performed on the top surface of memory stack 418 to remove any excess materials, e.g., from the depositions of the conductive materials and the dielectric material.

Figure 8:
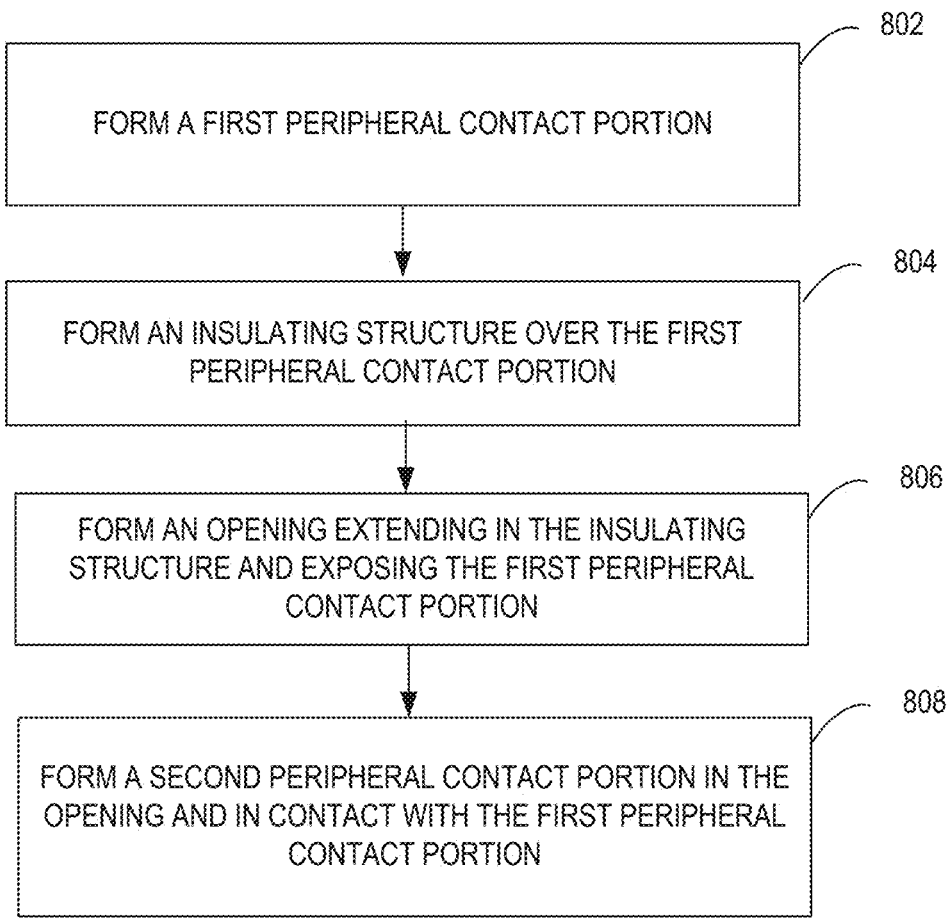
FIG. 8 illustrates a flowchart of an exemplary fabrication process for forming a 3D memory device having a peripheral contact structure, according to some embodiments of the present disclosure.

FIGS. 5A-5B illustrate cross-sectional views of a 3D memory device at various stages of an exemplary fabrication method 500 for forming a peripheral contact structure, according to some embodiments. The peripheral contact structure may be similar to or the same as peripheral contact structure 208 described in FIGS. 2A and 2B. FIG. 8 illustrates a flowchart 800 of method 500, according to some embodiments. It is understood that the operations shown in method 500 are not exhaustive and that other operations can be performed as well before, after, or between any of the illustrated operations. Further, some of the operations may be performed simultaneously, or in a different order than shown in FIGS. 5 and 8.

At the beginning of the process, a first peripheral contact portion is formed in a substrate (Operation 802). FIG. 5A illustrates a corresponding structure.

As shown in FIG. 5A, a first peripheral contact portion 510-1 may be formed in substrate 402. The description of the formation of first peripheral contact portion 510-1 can be referred to the description of the conductive portion illustrated in FIGS. 3A-3C, and the detailed description is not repeated herein.

Referring back to FIG. 8, after the formation of the first peripheral contact portion 510-1, method 500 proceeds to Operation 804, in which an insulating structure is formed over the first peripheral contact portion. FIG. 5A illustrates a corresponding structure.

As shown in FIG. 5A, an insulating structure 504 may be formed over first peripheral contact portion 510-1. In some embodiments, insulating structure 504 is deposited after the formation of the staircase structure in the respective dielectric stack (e.g., dielectric stack 408). Insulating structure 504 may surround the dielectric stack such that the dielectric stack is in insulating structure 504. In some embodiments, insulating structure 504 includes silicon oxide and is deposited by ALD, CVD, and/or PVD.

Referring back to FIG. 8, after the formation of the insulating structure, method 500 proceeds to Operation 806, in which an opening is formed extending in the insulating structure and exposing the first peripheral contact portion. FIG. 5A illustrates a corresponding structure.

As shown in FIG. 5A, an opening 512 may be formed in insulating structure 504. Opening 512 may extend vertically in insulating structure 504 and exposing first peripheral contact portion 510-1. In some embodiments, a lateral dimension of opening 512 (e.g., along the x-axis and/or they-axis) is less than or equal to a lateral dimension of first peripheral contact portion 510-1 along the same lateral direction(s). In some embodiments, opening 512 is formed by a suitable etching process such as dry etch and/or wet etch.

Referring back to FIG. 8, after the formation of the opening, method 500 proceeds to Operation 808, in which a second peripheral contact portion is formed in the opening and in contact with the first peripheral contact portion. FIG. 8B illustrates a corresponding structure.

As shown in FIG. 5B, a second peripheral contact portion 510-2 is formed in opening 512. In some embodiments, an adhesive layer, e.g., TiN, is deposited along the sidewall and the bottom surface of opening 512. In some embodiments, the adhesive layer may be in contact with first peripheral contact portion 510-1 (e.g., the conductive material of first peripheral contact portion 510-1). Further, a conductive material, e.g., tungsten, is deposited to fill up opening 512. The conductive material and the adhesive layer (if any) may form second peripheral contact portion 510-2. A peripheral contact structure 510, having first peripheral contact portion 510-1 and second peripheral contact portion 510-2 in contact and conductively connected with each other, may be formed.

According to embodiments of the present disclosure, a 3D memory device includes a substrate, a memory stack on the substrate; and a source contact structure extending vertically through the memory stack. The source contact structure includes a first source contact portion in the substrate and having a conductive material different from the substrate. The source contact structure also includes a second source contact portion above, in contact with, and conductively connected to the first source contact portion.

In some embodiments, a bottom surface of the first source contact portion is below a top surface of the substrate and a top surface of the first source contact portion is coplanar with the top surface of the substrate.

In some embodiments, the first source contact portion includes a first conductive material that comprises at least one of tungsten, cobalt, aluminum, copper, silicides, or polysilicon.

In some embodiments, the first source contact portion further includes an adhesive layer between the substrate and the first conductive material.

In some embodiments, the first source contact portion extends continuously along a lateral direction the source contact structure extends.

In some embodiments, the second source contact portion includes at least two sub-contacts disconnected from each other along the lateral direction.

In some embodiments, a lateral dimension of the first source contact portion is greater than a lateral dimension of the second source contact portion along a second lateral direction perpendicular to the lateral direction.

In some embodiments, the lateral dimension of the first source contact portion is unchanged along the lateral direction.

In some embodiments, the second source contact portion includes a second conductive material in contact with the first conductive material of the first source contact portion at an interface coplanar with the top surface of the substrate.

In some embodiments, the second conductive material is different from the first conductive material and includes at least one of tungsten, cobalt, aluminum, copper, silicides, or polysilicon.

In some embodiments, the second source contact portion includes the first conductive material above and in contact with the second conductive material.

In some embodiments, the memory stack includes interleaved a plurality of conductor layers and a plurality of dielectric layers.

According to embodiments of the present disclosure, a 3D memory device includes a substrate, a memory stack on the substrate, a memory string extending vertically through the memory stack a source contact extending vertically through the memory stack, and a metal layer in the substrate. The metal layer is in contact with and conductively connected to the source contact.

In some embodiments, a bottom surface of the metal layer is below a top surface of the substrate and a top surface of the metal layer is coplanar with the top surface of the substrate.

In some embodiments, the metal layer includes a first conductive material that includes at least one of tungsten, cobalt, aluminum, copper, silicides, or polysilicon.

In some embodiments, the 3D memory device further includes an adhesive layer between the substrate and metal layer.

In some embodiments, the metal layer extends continuously along a lateral direction the source contact extends.

In some embodiments, the source contact includes at least two sub-contacts disconnected from each other along the lateral direction.

In some embodiments, a lateral dimension of the metal layer is greater than a lateral dimension of the source contact along a second lateral direction perpendicular to the lateral direction.

In some embodiments, the lateral dimension of the metal layer is unchanged along the lateral direction.

In some embodiments, the source contact includes a second conductive material in contact with the metal layer at an interface coplanar with the top surface of the substrate.

In some embodiments, the second conductive material is different from the first conductive material and includes at least one of tungsten, cobalt, aluminum, copper, silicides, or polysilicon.

In some embodiments, the source contact includes the first conductive material above and in contact with the second conductive material.

In some embodiments, the memory stack includes interleaved a plurality of conductor layers and a plurality of dielectric layers.

According to embodiments of the present disclosure, a method for forming a 3D memory device includes forming a first source contact portion in a substrate, forming a dielectric stack over the first source contact portion, and forming a slit opening extending in the dielectric stack and exposing the first source contact portion. The method also includes forming a plurality of conductor layers through the slit opening and form a second source contact portion in the slit opening and in contact with the first source contact portion.

In some embodiments, forming the first source contact portion includes forming a source contact pattern in the substrate and extending continuously along a lateral direction and depositing a conductive material to fill up the source contact pattern.

In some embodiments, the method further includes planarizing the conductive material to form the first source contact portion.

In some embodiments, the method further includes depositing an adhesive layer in the source contact pattern before the deposition of the conductive material.

In some embodiments, forming the dielectric stack includes forming interleaved a plurality of sacrificial layers and a plurality of dielectric layers.

In some embodiments, forming the slit opening includes forming a plurality of slit portions along the lateral direction, at least two of the slit portions being disconnected from each other along the lateral direction and each exposing the first source contact portion.

In some embodiments, forming the plurality of conductor layers includes removing the plurality of sacrificial layers through the slit opening to form a plurality of lateral recesses, and depositing a conductor material to fill in the lateral recesses to form the conductor layers.

In some embodiments, forming the second source contact portion includes depositing another conductive material in the slit opening, the other conductive material being in contact with the conductive material at an interface coplanar with the top surface of the substrate.

In some embodiments, the method further includes depositing the conductive material above and in contact with the other conductive material in the slit opening.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming a first source contact portion including a metal in a substrate;
    forming a dielectric stack over the first source contact portion;
    forming a slit opening extending in the dielectric stack and exposing the first source contact portion;
    forming a plurality of conductor layers through the slit opening; and
    forming a second source contact portion in the slit opening and in contact with the first source contact portion.

2. A method for forming a three-dimensional (3D) memory device, comprising:
    forming a first source contact portion in a substrate, comprising:
        forming a source contact pattern in the substrate and extending continuously along a lateral direction; and
        depositing a first conductive material including at least one of tungsten, cobalt, aluminum, and copper to fill up the source contact pattern;
    forming a dielectric stack over the first source contact portion;
    forming a slit opening extending in the dielectric stack and exposing the first source contact portion;
    forming a plurality of conductor layers through the slit opening; and
    forming a second source contact portion in the slit opening and in contact with the first source contact portion.

3. The method of claim 2, further comprising planarizing the first conductive material to form the first source contact portion.

4. The method of claim 2, further comprising depositing an adhesive layer in the source contact pattern before the deposition of the first conductive material.

5. The method of claim 2, wherein forming the dielectric stack comprises forming interleaved a plurality of sacrificial layers and a plurality of dielectric layers.

6. The method of claim 5, wherein forming the slit opening comprises forming a plurality of slit portions along the lateral direction, at least two of the slit portions being disconnected from each other along the lateral direction and each exposing the first source contact portion.

7. The method of claim 6, wherein forming the plurality of conductor layers comprises:
    removing the plurality of sacrificial layers through the slit opening to form a plurality of lateral recesses; and
    depositing a conductor material to fill in the lateral recesses to form the conductor layers.

8. The method of claim 2, wherein forming the second source contact portion comprises depositing a second conductive material in the slit opening, the second conductive material being in contact with the first conductive material at an interface coplanar with a top surface of the substrate.

9. The method of claim 8, further comprising depositing the first conductive material above and in contact with the second conductive material in the slit opening.

10. The method of claim 2, wherein forming the second source contact portion comprising forming a plurality of sub-contacts that are separated by an insulating spacer.

11. A method for forming a three-dimensional (3D) memory device, comprising:
    forming a first source contact portion in a substrate;
    forming a dielectric stack over the first source contact portion;
    forming a slit opening extending in the dielectric stack and exposing the first source contact portion;
    forming a plurality of conductor layers through the slit opening; and
    form a second source contact portion in the slit opening and in contact with the first source contact portion, wherein the second source contact portion including a plurality of sub-contacts that are separated by an insulating spacer.

12. The method of claim 11, wherein forming the first source contact portion comprises:
    forming a source contact pattern in the substrate and extending continuously along a lateral direction; and depositing a first conductive material including at least one of a metal and a silicide to fill up the source contact pattern.

13. The method of claim 12, further comprising planarizing the first conductive material to form the first source contact portion.

14. The method of claim 12, further comprising depositing an adhesive layer in the source contact pattern before the deposition of the first conductive material.

15. The method of claim 11, wherein forming the dielectric stack comprises forming interleaved a plurality of sacrificial layers and a plurality of dielectric layers.

16. The method of claim 15, wherein forming the slit opening comprises forming a plurality of slit portions along the lateral direction, at least two of the slit portions being disconnected from each other along the lateral direction and each exposing the first source contact portion.

17. The method of claim 16, wherein forming the plurality of conductor layers comprises:
removing the plurality of sacrificial layers through the slit opening to form a plurality of lateral recesses; and
depositing a conductor material to fill in the lateral recesses to form the conductor layers.

18. The method of claim 12, wherein forming the second source contact portion comprises depositing a second conductive material in the slit opening, the second conductive material being in contact with the first conductive material at an interface coplanar with a top surface of the substrate.

19. The method of claim 18, further comprising depositing the first conductive material above and in contact with the second conductive material in the slit opening.

20. The method of claim 14, wherein depositing the adhesive layer comprises depositing at least one of titanium, titanium nitride, tantalum, and tantalum nitride.

* * * * *